(12) United States Patent
Ghyselen et al.

(10) Patent No.: US 8,173,512 B2
(45) Date of Patent: *May 8, 2012

(54) FORMING STRUCTURES THAT INCLUDE A RELAXED OR PSEUDO-RELAXED LAYER ON A SUBSTRATE

(75) Inventors: Bruno Ghyselen, Seyssinet-Pariset (FR); Carlos Mazure, St. Nazaire les Eymes (FR); Emmanuel Arene, Biviers (FR)

(73) Assignee: Soitec, Bernin (FR)

( * ) Notice: Subject to any disclaimer, the term of this patent is extended or adjusted under 35 U.S.C. 154(b) by 0 days.

This patent is subject to a terminal disclaimer.

(21) Appl. No.: 13/080,436

(22) Filed: Apr. 5, 2011

(65) Prior Publication Data

US 2011/0217825 A1 Sep. 8, 2011

Related U.S. Application Data

(63) Continuation of application No. 12/769,299, filed on Apr. 28, 2010, now Pat. No. 7,919,393, which is a continuation of application No. 11/345,495, filed on Feb. 2, 2006, now Pat. No. 7,736,988, which is a continuation of application No. 10/784,016, filed on Feb. 20, 2004, now Pat. No. 7,018,909.

(60) Provisional application No. 60/483,476, filed on Jun. 26, 2003.

(30) Foreign Application Priority Data

Feb. 28, 2003  (FR) ...................... 03 02518

(51) Int. Cl.
*H01L 21/76* (2006.01)

(52) U.S. Cl. .................... 438/406; 438/455; 438/458

(58) Field of Classification Search .................. 438/406, 438/455, 458

See application file for complete search history.

(56) References Cited

U.S. PATENT DOCUMENTS

| 4,994,867 A | 2/1991 | Biegelsen ...................... 357/16 |
| 5,391,257 A | 2/1995 | Sullivan et al. ................ 156/630 |
| 5,461,243 A | 10/1995 | Ek et al. ......................... 257/190 |
| 5,670,411 A | 9/1997 | Yonehara et al. ............. 438/459 |
| 5,882,987 A | 3/1999 | Sirikrishnan ................. 438/458 |

(Continued)

FOREIGN PATENT DOCUMENTS

DE  101 00 194 A1  7/2001

(Continued)

OTHER PUBLICATIONS

Di Cioccio et al., "III-V layer transfer onto silicon and applications," Phys. Stat. Sol. (a), 4:509-515 (2005).

(Continued)

*Primary Examiner* — Thien F Tran

(74) *Attorney, Agent, or Firm* — Winston & Strawn LLP

(57) ABSTRACT

A method for forming a structure that includes a relaxed or pseudo-relaxed layer on a substrate. The method includes the steps of growing an elastically stressed layer of semiconductor material on a donor substrate; forming a glassy layer of a viscous material on the stressed layer; removing a portion of the donor substrate to form a structure that includes the glassy layer, the stressed layer and a surface layer of donor substrate material; patterning the stressed layer; and heat treating the structure at a temperature of at least a viscosity temperature of the glassy layer to relax the stressed layer and form the relaxed or pseudo-relaxed layer of the structure.

8 Claims, 7 Drawing Sheets

U.S. PATENT DOCUMENTS

| | | | | |
|---|---|---|---|---|
| 5,906,951 | A | 5/1999 | Chu et al. | 438/751 |
| 6,059,895 | A | 5/2000 | Chu et al. | 148/33.1 |
| 6,100,166 | A | 8/2000 | Sakaguchi et al. | 438/455 |
| 6,214,733 | B1 | 4/2001 | Sickmiller | 438/691 |
| 6,352,942 | B1 | 3/2002 | Luan et al. | 438/770 |
| 6,406,795 | B1 | 6/2002 | Hwang et al. | 428/457 |
| 6,524,935 | B1 | 2/2003 | Canaperi et al. | 438/478 |
| 6,573,126 | B2 | 6/2003 | Cheng et al. | 438/149 |
| 6,633,066 | B1 | 10/2003 | Bae et al. | 257/347 |
| 6,794,276 | B2 | 9/2004 | Letertre et al. | 438/506 |
| 6,828,214 | B2 | 12/2004 | Notsu et al. | 438/455 |
| 7,008,701 | B2 | 3/2006 | Notsu et al. | 428/641 |
| 7,018,909 | B2 | 3/2006 | Ghyselen et al. | 438/455 |
| 7,273,798 | B2 | 9/2007 | Lester et al. | 438/458 |
| 7,282,381 | B2 | 10/2007 | Feltin et al. | 438/46 |
| 7,585,792 | B2 | 9/2009 | Celler | 438/795 |
| 7,736,935 | B2 | 6/2010 | Faure et al. | 438/59 |
| 7,736,988 | B2 * | 6/2010 | Ghyselen et al. | 438/406 |
| 7,919,393 | B2 * | 4/2011 | Ghyselen et al. | 438/458 |
| 2002/0072130 | A1 | 6/2002 | Cheng et al. | 438/10 |
| 2002/0089032 | A1 | 7/2002 | Huang | 257/507 |
| 2002/0146892 | A1 | 10/2002 | Notsu et al. | 438/455 |
| 2002/0168864 | A1 | 11/2002 | Cheng et al. | 438/725 |
| 2003/0003679 | A1 | 1/2003 | Doyle et al. | 438/406 |
| 2003/0013305 | A1 | 1/2003 | Sugii et al. | 438/689 |
| 2003/0064535 | A1 | 4/2003 | Kub et al. | 438/22 |
| 2003/0155568 | A1 | 8/2003 | Cheng et al. | 257/12 |
| 2003/0168654 | A1 | 9/2003 | Cheng et al. | 257/19 |
| 2004/0192067 | A1 | 9/2004 | Ghyselen et al. | 428/763 |
| 2004/0253792 | A1 | 12/2004 | Cohen et al. | 438/400 |
| 2005/0250294 | A1 | 11/2005 | Ghyselen | 438/458 |
| 2006/0094140 | A1 | 5/2006 | Inoguchi et al. | 438/22 |
| 2006/0128117 | A1 | 6/2006 | Ghyselen et al. | 438/455 |
| 2006/0175608 | A1 | 8/2006 | Celler | 257/49 |
| 2006/0205180 | A1 | 9/2006 | Henley et al. | 438/458 |
| 2006/0211219 | A1 | 9/2006 | Henley et al. | 438/458 |
| 2007/0048975 | A1 | 3/2007 | Chen et al. | 438/478 |
| 2007/0069225 | A1 | 3/2007 | Krames et al. | 257/94 |
| 2007/0072324 | A1 | 3/2007 | Krames et al. | 438/46 |
| 2007/0241353 | A1 | 10/2007 | Taki | |
| 2007/0278622 | A1 | 12/2007 | Lester et al. | 257/615 |
| 2007/0298549 | A1 | 12/2007 | Jurczak et al. | 438/149 |
| 2008/0038564 | A1 | 2/2008 | Bruel | 428/446 |
| 2008/0113496 | A1 | 5/2008 | Keller et al. | 438/481 |
| 2008/0169483 | A1 | 7/2008 | Kasai et al. | 257/183 |
| 2009/0050917 | A1 | 2/2009 | Nakagawa et al. | 257/98 |
| 2009/0261344 | A1 | 10/2009 | Celler | 257/75 |
| 2010/0032793 | A1 | 2/2010 | Guenard et al. | 257/507 |
| 2010/0032805 | A1 | 2/2010 | Letertre et al. | 257/615 |

FOREIGN PATENT DOCUMENTS

| | | |
|---|---|---|
| EP | 0 651 439 A2 | 5/1995 |
| EP | 0 858 110 A1 | 8/1998 |
| EP | 1 248 294 A2 | 10/2002 |
| EP | 1 378 591 A1 | 1/2004 |
| EP | 1 671 361 B1 | 6/2006 |
| EP | 1 901 345 A1 | 3/2008 |
| FR | 2 775 121 A1 | 8/1999 |
| FR | 2 818 010 A1 | 6/2002 |
| FR | 2 895 420 A1 | 6/2007 |
| FR | 2 895 562 A1 | 6/2007 |
| JP | 2001-094082 A | 4/2001 |
| JP | 2001-168342 A | 6/2001 |
| JP | 2001-217433 A | 8/2001 |
| JP | 2002-305293 A | 10/2002 |
| JP | 2003-017705 A | 1/2003 |
| WO | WO 99/53539 A1 | 10/1999 |
| WO | WO 02/15244 A2 | 2/2002 |
| WO | WO 02/43153 A1 | 5/2002 |
| WO | WO 02/47156 A1 | 6/2002 |

OTHER PUBLICATIONS

Feng et al., "Stress Generation and Relaxation during Film Heteroepitaxy on a Compliant Substrate with a Viscoelastic Glass Interlayer," Mat. Res. Soc. Symp. Proc., 696:N3.19.1-N3.19.6 (2002).

Hansen et al., "Development of a glass-bonded compliant substrate," Journal of Crystal Growth, 195:144-150 (1998).

Huang et al., "Mechanics of Relaxing SiGe Islands on a Viscous Glass," Acta Mechanica Sinica (English Series), 18(5):441-456 (2002).

Kostrzewa et al., "Feasibility of Strain Relaxed InAsP and InGaAs Compliant Substrates," International Conference on Indium Phosphide and Related Materials, May 12-16, 2003, pp. 437-440.

Mooney et al., "Elastic strain relaxation in free-standing SiGe/Si structures," Applied Physics Letters, 84(7):1093-1095 92004).

Moran et al., "Kinetics of Strain Relaxation in Semiconductor Films Grown on Borosilicate Glass-Bonded Substrates," Journal of Electronic Materials, 30(7):802-806 (2001).

Peng et al., "Influence of GaN polarity and intermediate-temperature buffer layers on strain relaxation and defects," Physica B, 391:6-11 (2007).

Yin et al., "Strain relaxation of SiGe islands on compliant oxide," Journal of Applied Physics, 91(12):9716-9722 (2002).

Yin et al., "Fully-depleted Strained-Si on Insulator NMOSFETs without Relaxed SiGe Buffers,"IEEE International Electron Devices Meeting, 2003, IEDM '03 Technical Digest, pp. 3.2.1-3.2.4.

Yin et al., "Buckling suppression of SiGe islands on compliant substrates," Journal of Applied Physics, 94(10):6875-6882 (2003).

Yin et al., "Tunable uniaxial vs biaxial in-plane strain using compliant substrates," Applied Physics Letters, 87:061922 (2005).

European Search Report dated Apr. 14, 2009 for application No. EP 08290759.

European Search Report dated Mar. 16, 2009 for application No. EP 08290757.

International Search Report dated Sep. 23, 2009 for application No. PCT/EP2009/004790.

International Search Report dated Mar. 25, 2010 for application No. PCT/EP2009/005694.

U.S. Appl. No. 12/341,722, filed Dec. 22, 2008.

U.S. Appl. No. 13/056,572, filed Mar. 4, 2011.

Non-Final Office Action mailed Mar. 2, 2011 for U.S. Appl. No. 12/341,722, filed Dec. 22, 2008.

J.-P. Colinge, "Silicon-on-Insulator Technology: Materials to VLSI, 2nd Edition," Kluwer Academic Publishers, pp. 50-51 (1997).

K.D. Hobart et al., "Compliant Substrates: A Comparative Study of the Relaxation Mechanisms of Strained Films Bonded to High and Low Viscosity Oxides," Journal of Electronic Materials, 29:897-900 (2000).

B. Hollander et al., "Strain relaxation of pseudomorphic $Si_{1-x}Ge_x$/si(100) heterostructures after hydrogen or helium ion implantation for virtual substrate fabrication," Nuclear Instruments and Methods in Physics Research B, 175-177:357-367 (2001).

S. Mantl et al., "Strain relaxation of epitaxial SiGe layers on Si(100) improved by hydrogen implantation," Nuclear Instruments and Methods in Physics Research B, 147:29-34 (1999).

F. Schaffler, "High mobility Si and Ge Structures," Semicond. Sci. Technol., 12:1515-1549 (1997).

T. Tezuka et al., "High-performance Strained Si-on-Insulator MOSFETs by Novel Fabrication Processes Utilizing Ge-Condensation Technique," Symposium on VLSI Technology Digest of Technical Papers, pp. 96-97 (2002).

Q.-Y. Tong et al., Extracts of "Semiconductor on Wafer Bonding: Science and Technology," John Wiley & Sons, Inc. (1999).

* cited by examiner

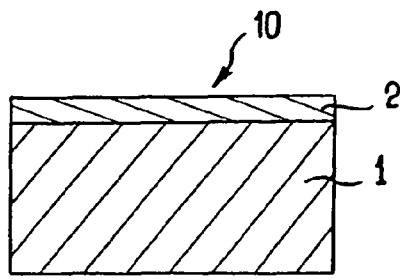
FIG_2a
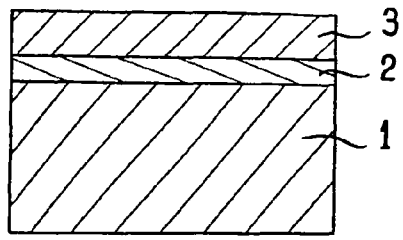
FIG_2b
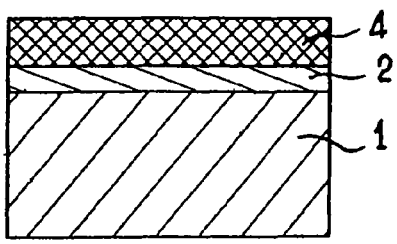
FIG_2c
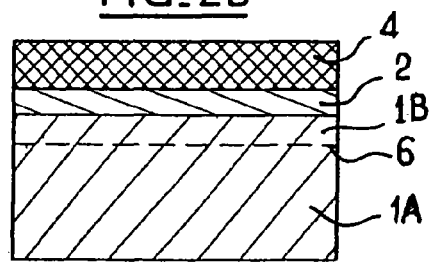
FIG_2d
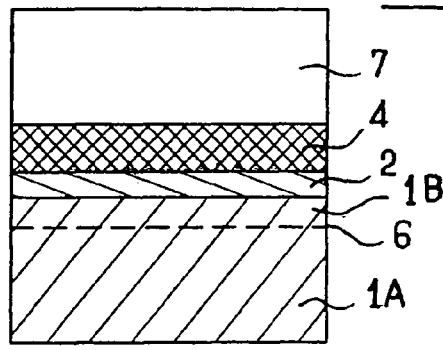
FIG_2e
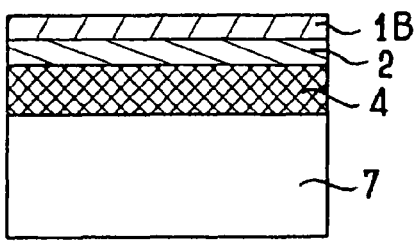
FIG_2f
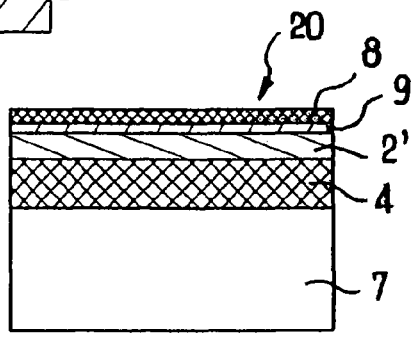
FIG_2g
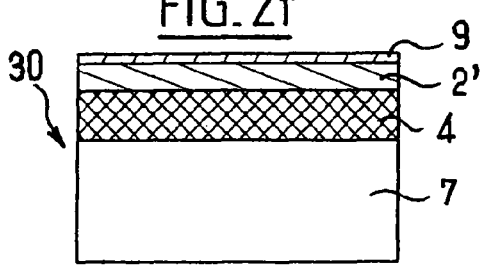
FIG_2h
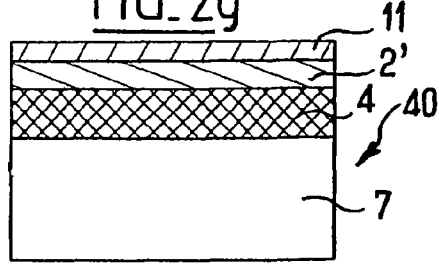
FIG_2i

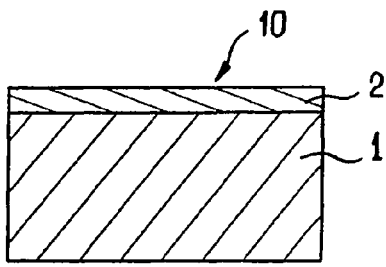
FIG_4a
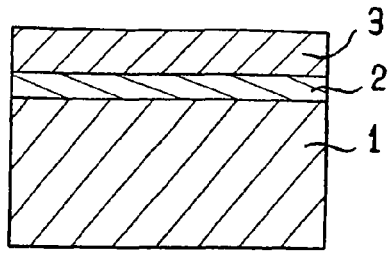
FIG_4b
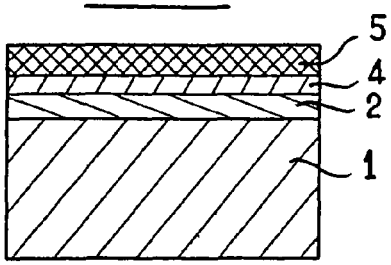
FIG_4c
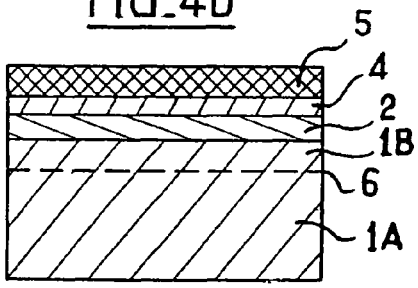
FIG_4d
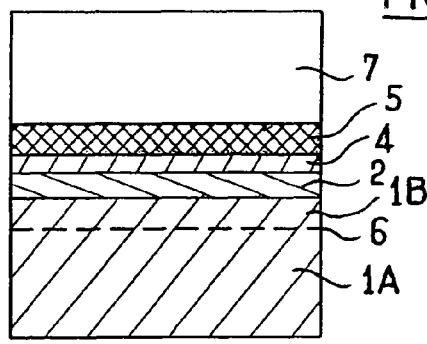
FIG_4e
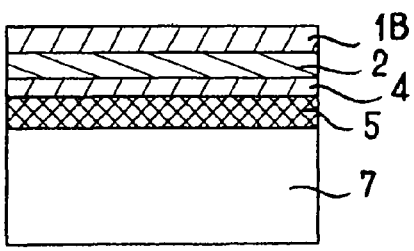
FIG_4f
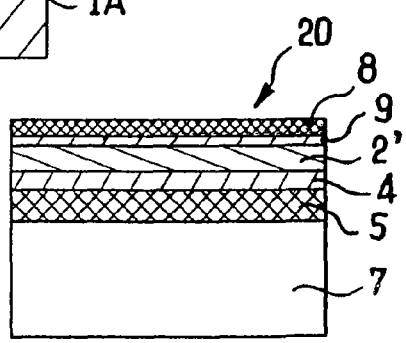
FIG_4g
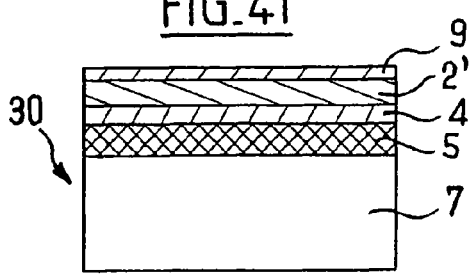
FIG_4h
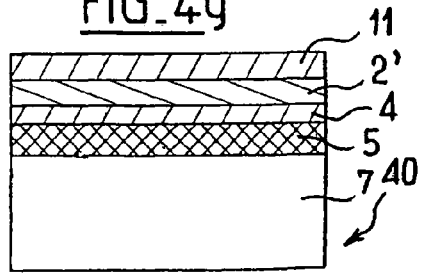
FIG_4i

FORMING STRUCTURES THAT INCLUDE A RELAXED OR PSEUDO-RELAXED LAYER ON A SUBSTRATE

CROSS-REFERENCE TO RELATED APPLICATIONS

This application is a continuation of application Ser. No. 12/769,299 filed Apr. 28, 2010, now U.S. Pat. No. 7,919,393, which is a continuation of application Ser. No. 11/345,495 filed Feb. 2, 2006, now U.S. Pat. No. 7,736,988, which is a continuation of application Ser. No. 10/784,016 filed Feb. 20, 2004, now U.S. Pat. No. 7,018,909, which claims the benefit of provisional application 60/483,476 filed Jun. 26, 2003. The entire content of each prior application is expressly incorporated herein by reference thereto.

BACKGROUND ART

The present invention generally relates to the formation of a relaxed or pseudo-relaxed layer on a substrate. The relaxed layer may be made of a material selected from semiconductor materials, in order to form a final structure for electronics, optics or optoelectronics, such as a semiconductor-on-insulator structure.

A layer is "relaxed" if its crystalline material has a lattice parameter substantially identical to its nominal lattice parameter, wherein the lattice parameter of the material is in its bulk equilibrium form. Conversely, a layer is "strained" if its crystalline material is elastically stressed in tension or in compression during crystal growth, such as during epitaxy, which forces its lattice parameter to be substantially different from its nominal lattice parameter.

Methods for forming a relaxed layer on a substrate are known. A method for doing so includes conducting epitaxial growth of a thin layer of semiconductor material on a donor substrate, bonding a receiver substrate at the thin layer; and then removing a part of the donor substrate. A semiconductor-on-insulator structure can thus be made. The semiconductive thickness consists partially of the relaxed thin layer, and the insulating layer is usually formed in an intermediate step between the epitaxial and bonding steps.

The thin layer may be fabricated during an epitaxial step or during subsequent treatment. In the first case, it is known to use a donor substrate consisting of a backing substrate and a buffer layer, the buffer layer confining plastic deformations so that the epitaxial thin layer is relaxed from any stress. Such methods are, for example, described in published documents US 2002/0072130 and WO 99/53539. However, a buffer layer is often time consuming and costly to make. In the second case, the donor substrate does not comprise any buffer layer and the epitaxial step then consists of growing the thin layer to be stressed by the donor substrate. Thus, for example, a SiGe layer will be grown directly on a Si substrate that has a thickness such that the SiGe layer is globally stressed.

A first technique for relaxing the SiGe layer, notably as described in the document of B. Höllander et al. entitled "Strain relaxation of pseudomorphic $Si_{1-x}Ge_x/Si(100)$ heterostructures after hydrogen or helium ion implantation for virtual substrate fabrication" (in Nuclear and Instruments and Methods in Physics Research B 175-177 (2001) 357-367) consists of relaxing the SiGe layer, before applying a bonding step, by implanting hydrogen or helium ions in the Si substrate at a predetermined depth. However, relaxation rates usually obtained with this first technique remain rather low as compared with other techniques.

A second technique is disclosed in the document entitled "Compliant Substrates: A comparative study of the relaxation mechanisms of strained films bonded to high and low viscosity" by Hobart et al. (Journal of Electronic Materials, vol. 29, No. 7, 2000). After removing the donor substrate during a removal step, heat treatment is applied for relaxing or pseudo-relaxing a layer of stressed SiGe, bonded to a BPSG glass during the bonding step. During the heat treatment, the stressed layer thus seems to relax via the layer of glass which has become viscous due to the treatment's temperature. However, this latter technique involves relaxation of the SiGe thin layer when the latter is exposed. Exposure of such a SiGe layer (exposed) to a gas atmosphere during heat treatment (such as a room RTA treatment, a sacrificial oxidization, or a recovery anneal) may prove to be disastrous for the quality of this layer, wherein Ge contained in the layer may diffuse outwards (which may cause decomposition of the layer) and the layer may be contaminated by external contaminants.

Furthermore, such a SiGe layer is on the surface and may therefore have to undergo special treatment such as finishing treatments (polishing, smoothening, oxidization, cleanings, etc.). At the present, such treatments for SiGe are not as effective as those for Si. This lack of control when working with SiGe causes further difficulties for making a desired structure.

The present invention now overcomes these problems.

SUMMARY OF THE INVENTION

The invention relates to methods of forming a structure that includes a relaxed or pseudo-relaxed layer on a substrate. The method includes the steps of growing an elastically stressed layer of semiconductor material on a donor substrate; forming a glassy layer of a viscous material on the stressed layer; removing a portion of the donor substrate to form a structure that includes the glassy layer, the stressed layer and a surface layer of donor substrate material; patterning the stressed layer; and heat treating the structure at a temperature of at least a viscosity temperature of the glassy layer to relax the stressed layer and form the relaxed or pseudo-relaxed layer of the structure.

Preferably, the patterning comprises etching islands in the stressed layer to contribute to relaxation of the stressed layer during the heat treating. Advantageously, components can be formed on the islands. These components can be formed after forming the relaxed or pseudo-relaxed layer, or during or in continuity with the heat treating.

Often, it is useful to apply an epitaxial growth process to provide at least one epitaxial layer on the structure. The epitaxial growth process can provide at least one epitaxial layer by applying one or more of a a SiGe or SiGeC layer, or of a stressed Si or SiC layer, or successive epitaxial growths of SiGe or SiGeC layers or of alternately stressed Si or SiC layers in order to form a multilayer structure. Preferably, the surface layer is removed before providing at least one epitaxial layer on the structure. When components are to be applied to the structure, these can be applied upon the stressed layer, the relaxed or pseudo-relaxed layer, or upon the epitaxial layer. Thereafter, one or more finishing treatments can be applied to the multilayer structure to improve properties.

The stressed layer is preferably a material of Groups III-V or II-VI with SiGe as an illustrative example. 12. The material of the glassy layer is one that becomes viscous at a certain viscosity temperature of above about 900° C.

The method can include bonding a receiver substrate to the structure to form a second structure before removing part of the donor substrate and forming a third structure comprising the receiver substrate, the relaxed or pseudo-relaxed layer, the glassy layer and the surface layer. The glassy layer may be formed on the receiving substrate prior to bonding with the stressed layer. If desired, a bonding layer typically of silicon dioxide can be applied onto at least one of the patterned layer or the receiver substrate prior to bonding. A zone of weakness can be provided in the donor substrate so that the donor substrate can be detached along the zone of weakness. The donor substrate can be fabricated by forming a porous layer on a crystalline carrier substrate and growing a crystalline layer on the porous layer, such that the porous layer comprises the zone of weakness of the donor substrate. In this embodiment, the donor substrate can be detached along the weakened zone by at least one of chemical etching or mechanochemical etching. Alternatively, the zone of weakness is formed by implanting atomic species in the donor substrate so that the donor substrate can be detached along the weakened zone by applying thermal or mechanical energy.

BRIEF DESCRIPTION OF THE DRAWINGS

Other aspects, objects and advantages of the present invention will become more apparent upon reading the following detailed description of the preferred methods thereof, given as non-limiting examples, and made with reference to the appended drawings wherein:

FIGS. 2a-2i illustrate the different steps of a second method according to the invention;

FIGS. 4a-4i illustrate the different steps of a fourth method according to the invention;

DETAILED DESCRIPTION OF THE PREFERRED EMBODIMENTS

Figure 1A:
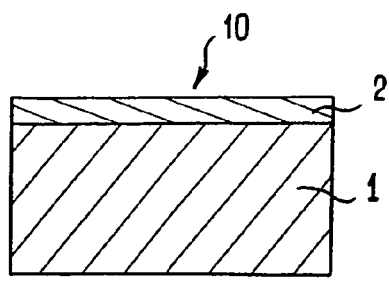
FIGS. 1a-1i illustrate the different steps of a first method according to the invention.

The present method overcomes the difficulties evident in the prior art by providing, according to a first aspect, a method of forming a relaxed or pseudo-relaxed layer on a substrate. The relaxed layer is a semiconductor material. The method includes growing an elastically stressed semiconductor layer on a donor substrate, and forming, on the stressed layer or on a receiving substrate, a glassy layer consisting of a viscous material that has an associated viscosity temperature. The technique further includes bonding the receiving substrate to the stressed layer via the glassy layer, removing a portion of the donor substrate so as to form a structure that includes the receiving substrate, the glassy layer, the stressed layer, and the unremoved portion of the donor substrate which forms a surface layer. Lastly, the structure is heat treated at a temperature close to or higher than the viscosity temperature.

Implementations also relate to structures obtained after utilizing the method of forming a relaxed or pseudo-relaxed layer on a substrate. An embodiment of such a structure includes a substrate, a first glassy layer on top of the substrate, a semiconductor layer on top of the first glassy layer, and a second glassy layer on top of the semiconductor layer, wherein the semiconductor layer, after transfer to a receiving substrate, forms a buried layer thereon. Another structure includes a layer of a semiconductor material having a top surface; a first glassy layer on the top surface of the substrate; a semiconductor layer on the first glassy layer; a second glassy layer on the semiconductor layer; and a receiving substrate, wherein the second glassy layer forms a buried layer on the receiving substrate. Yet another structure includes a receiving substrate having a top surface; a glassy layer on the top surface of the receiving substrate; and a relaxed $Si_{1-x}Ge_x$ layer on the glassy layer. Additional layers may be provided on the relaxed $Si_{1-x}Ge_x$ layer, such as another glassy layer, if desired.

The buried layer of the structure may be elastically stressed, or may be relaxed or pseudo-relaxed, and may be made of a $Si_{1-x}Ge_x$ material. Another semiconductor layer may be interposed between the buried layer and the second glassy layer, or may be interposed between the first glassy layer and the buried layer. Further, at least one of the first and second glassy layers may be made of a $SiO_2$ material.

A layer of Si stressed by a relaxed or pseudo-relaxed SiGe layer is useful for providing desirable properties in these structures, such as a charge carrier mobility of the order of 100%, larger than that present within a relaxed Si layer.

Other features of the method for forming a relaxed or pseudo-relaxed layer on a substrate include applying a controlled treatment after removing the portion of the donor substrate. The controlled treatment transforms at least a portion of the surface layer into a viscous material to form a second glassy layer having an associated second viscosity temperature. Further, the method may include heat treating the structure while forming or after forming the second glassy layer. The second glassy layer may thereafter be removed. A crystal growing step can also be advantageously applied to the structure, using a selected semiconductor material.

The technique can also include forming a glassy layer by growing a semiconductor layer on the stressed layer, and performing a controlled treatment in order to transform at least a portion of the layer into a viscous material having a particular viscosity temperature. The glassy layer can be electrically insulating and the structure can be a semiconductor-on-insulator structure, the semiconductive thickness of which includes the stressed layer which has been relaxed or pseudo-relaxed during the heating step.

According to a second aspect, the method provides a structure for forming a relaxed or pseudo-relaxed layer on a substrate. The structure includes a substrate, a first glassy layer, a buried layer of material selected from semiconductor materials, and a second glassy layer.

The present invention therefore pertains to forming a relaxed or pseudo-relaxed useful layer on a substrate. It also pertains to forming on the relaxed or pseudo-relaxed layer, a useful layer of stressed material. A "useful layer" is a layer intended to receive components for electronics, optics, or optoelectronics during subsequent treatments.

The present method also protects the layer to be relaxed or pseudo-relaxed from the atmosphere surrounding the structure in which it is contained, throughout the application of the method and especially during heat treatments. Such operation prevents at least one of the atomic species of the material from being able to diffuse.

The present method also permits application of different surface finishing techniques onto the desired structure during fabrication without damaging the quality of the layer to be relaxed or pseudo-relaxed. This can notably be achieved in the particular case when the layer to be relaxed or pseudo-relaxed is $Si_{1-x}Ge_x$, and when the use of different processing techniques on the structure, usually applied on Si structures or layers, is desired.

An implementation of the method is described with reference to FIGS. 1a to 1i. FIG. 1a shows a source wafer 10 that consists of a donor substrate 1 and a stressed $Si_{1-x}Ge_x$ layer 2. In a first configuration, the donor substrate 1 consists entirely of monocrystalline Si with a first lattice parameter. Advantageously, the donor substrate 1 is made by Czochralski growth. In a second configuration, the donor substrate 1 is a pseudo-substrate comprising an upper Si layer (not illustrated in FIG. 1), exhibiting an interface with the stressed layer 2 and having a first lattice parameter at its interface with the stressed layer 2. Advantageously, the first lattice parameter of the upper layer is the nominal lattice parameter of Si, so that the latter is in a relaxed state. The upper layer further has a sufficiently large thickness so as to be able to impose its lattice parameter to the overlying stressed layer 2, without the latter substantially influencing the crystalline structure of the upper layer of the donor substrate 1.

Whichever configuration is selected, the donor substrate 1 has a crystalline structure with a low density of structural defects, such as dislocations. Preferably, the stressed layer 2 only consists of a single thickness of $Si_{1-x}Ge_x$. The Ge concentration in this stressed layer 2 is preferably higher than 10%, i.e. an x value greater than 0.10. As Ge has a larger lattice parameter than Si by about 4.2%, the selected material for forming this stressed layer 2 thus has a second nominal lattice parameter which is substantially larger than the first lattice parameter. The formed stressed layer 2 is then elastically stressed in compression by the donor substrate 1, i.e. it is stressed so as to have a lattice parameter substantially less than the second lattice parameter of the material of which it is made, and therefore has a lattice parameter close to the first lattice parameter. Preferably, the stressed layer 2 further has a substantially constant composition of atomic elements.

Advantageously, the stressed layer 2 may be formed on the donor substrate 1 by crystal growth, such as by epitaxy by using known techniques such as for example, LPD, CVD and MBE (respective abbreviations of Liquid Phase Deposition, Chemical Vapor Deposition, and Molecular Beam Epitaxy) techniques. In order to obtain such a stressed layer 2, without too many crystallographic defects, such as for example point defects or extended defects such as dislocations, it is advantageous to select the crystalline materials forming the donor substrate 1 and the stressed layer (in the vicinity of its interface with the backing substrate 1) so that they have a sufficiently small difference between their first and their second respective nominal lattice parameters. For example, this lattice parameter difference is typically between about 0.5% and about 1.5%, but may also have larger values. For example, $Si_{1-x}Ge_x$ with x=0.3 has a nominal lattice parameter larger than Si by about 1.15%.

Figure 1B:
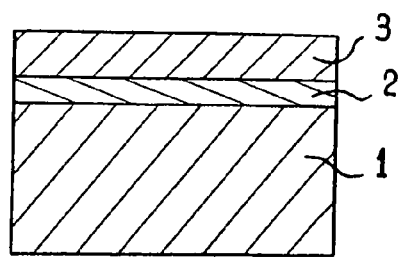
Figure 1C:
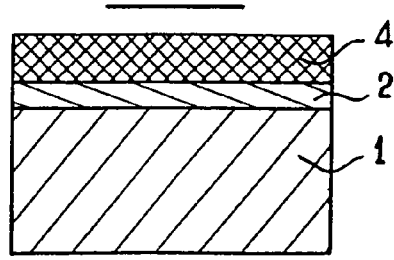
Figure 1D:
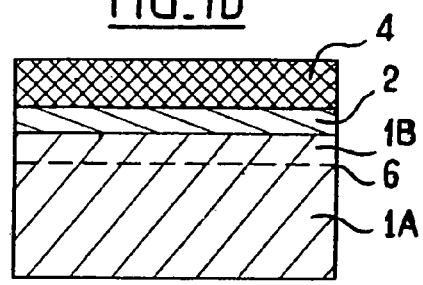
Figure 1E:
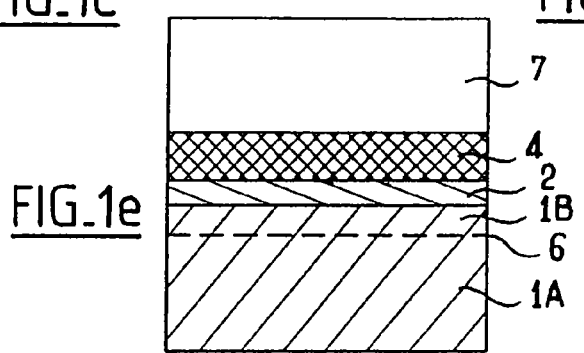
Figure 1F:
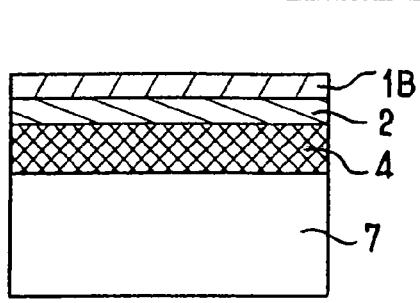
Figure 1G:
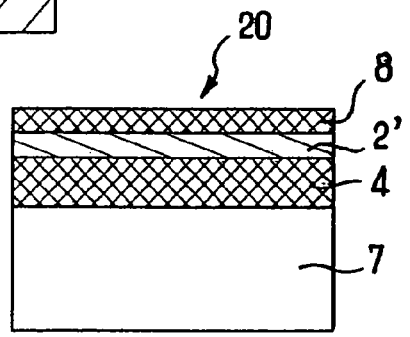
Figure 1H:
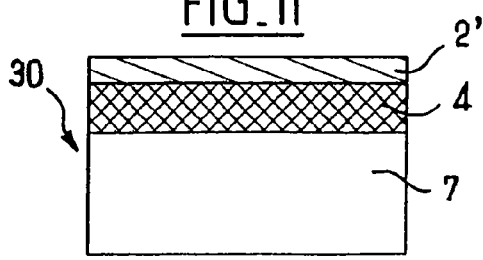
Figure 1I:
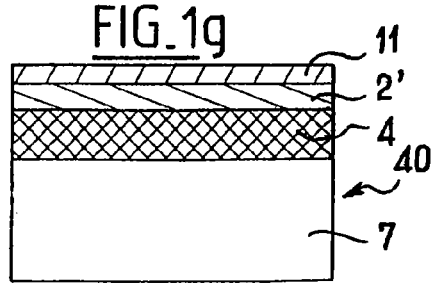

However, it is preferable that the stressed layer 2 have a substantially constant thickness, so that it has substantially constant intrinsic properties and/or facilitates the future bonding with a receiver substrate (as illustrated in FIG. 1i).

In order to prevent relaxation of the stressed layer 2, or occurrence of internal plastic type deformations, the thickness of the latter should further be less than a critical thickness for elastic stress. This critical elastic stress thickness depends mainly on the material selected for the stress layer 2 and on the lattice parameter difference with the donor substrate. But it also depends on growth parameters such as the temperature at which it has been formed, on nucleation sites formed during epitaxial growth, or on the growth techniques used (for example CVD or MBE).

Examples of critical thickness values for $Si_{1-x}Ge_x$ layers can be found by reference to the document entitled "High-mobility Si and Ge structures" by Friedrich Schäffler ("Semiconductor Science Technology" 12 (1997) 1515-1549). Concerning other materials, one skilled in the art can easily refer to state of the art publications in order to determine the value of the critical elastic stress thickness of a selected material for the stressed layer 2 formed on the donor substrate 1. Thus, a $Si_{1-x}Ge_x$ layer with x between 0.10 and 0.30 has a typical thickness between 200 Å and 2,000 Å, preferably between 200 Å and 500 Å by notably adapting the growth parameters. Once formed, the stressed layer 2 therefore has a lattice parameter substantially close to that of its growth substrate 1 and exhibits internal elastic stresses in compression.

With reference to FIG. 1c, a glassy layer 4 is formed on the stressed layer 2 according to a first embodiment. The material making up the glassy layer 4 becomes viscous when a viscosity temperature $T_G$ is reached. Advantageously, the material of the glassy layer 4 may be of one of the following materials: BPSG, $SiO_2$, SiON. When a $SiO_xN_y$ glassy layer 4 is formed, the value of y may advantageously be varied in order to change the viscosity temperature $T_G$ which is substantially a function of the nitrogen composition for this material. Thus, by growing a composition thereon, it is now possible to change the $T_G$ of the glassy layer 4 typically between a $T_G$ of the order of that of $SiO_2$ (which may vary around 1,150° C.) and a $T_G$ of the order of that of $Si_3N_4$ (which is higher than 1,500° C.). A large $T_G$ range may thereby be covered by varying y. The $T_G$ values of the glassy layer 4, if they essentially depend on the material of the glassy layer, may also fluctuate according to the conditions under which the glassy layer was formed. In an advantageous scenario, the conditions for forming the glassy layer 4 may thereby be adapted in a controlled manner in order to select a $T_G$ "à la carte". Deposition parameters such as temperature, duration, dosage and potential of the gas atmosphere, and the like, may thus be varied. Further, doping elements may be added to the main gaseous elements contained in the vitreous atmosphere, such as boron and phosphorus which may have the property of reducing $T_G$.

It is important that the stressed layer 2 be covered with the glassy layer 4 before germanium contained in the stressed layer 2 is able to diffuse into the atmosphere, and before the stressed layer 2 is contaminated significantly, and before the surface of the stressed layer 2 becomes reactive in an uncontrollable way. This last condition may occur when the whole undergoes heat treatment at high temperature, such as an RTA type annealing treatment or a sacrificial oxidization treatment.

In an advantageous embodiment of the glassy layer 4, the following steps are applied onto the stressed layer 2. With reference to FIG. 1b, a semiconductor material layer 3 is grown on the stressed layer 2. Next, with reference to FIG. 1c, a controlled treatment is applied to transform at least a portion of the layer formed in the first step into a viscous material, by heating to a viscosity temperature, for example, to thereby form the glassy layer 4. Advantageously, the material selected for the layer 3 is Si so that the stress level of the stressed layer 2 will not be changed. The thickness of the layer 3 that is formed is typically between about 5 Å and about 5,000 Å, and more particularly may be between about 100 Å and about 1,000 Å.

For the same reasons explained above, crystal growing during the growth step of the layer 3 is preferably applied before diffusion of Ge. That is, shortly after the formation of the stressed layer 2 if the temperature for forming the stressed layer 2 is maintained, or a rise in temperature subsequent to a fall in temperature to room temperature having been caused immediately after forming the stressed layer 2.

The preferred method for growing layer 3 is in situ growth directly in continuation of the growth of the stressed layer 2. The growth technique used may be an epitaxy LPD, CVD or MBE technique. The glassy layer 4 may be made by heat treatment under an atmosphere with a predetermined composition.

Thus, a Si layer 3 may undergo a controlled heat oxidization treatment in order to transform this layer 3 into a $SiO_2$ glassy layer 4. During the latter step, it is important to accurately control the parameters of the oxidization treatment (such as temperature, duration, oxygen concentration, the amounts of other gases in the oxidizing atmosphere, etc.) in order to control the oxide thickness and to stop oxidization in the vicinity of the interface between both layers 2 and 3. For such thermal oxidization, a dry oxygen or steam atmosphere will preferably be used at a pressure equal to or larger than 1 atm. Preferably, the oxidization duration will then be varied in order to control the oxidization of layer 3. However, this control may be made by varying one or several other parameters, either in combination or not, with the time parameter. If necessary, reference may be made to U.S. Pat. No. 6,352,942 for more details concerning an embodiment of such a $SiO_2$ glassy layer 4 on a SiGe layer.

According to a second embodiment of the glassy layer 4, and as a replacement for the growth and controlled treatment steps illustrated by FIGS. 1b and 1c, respectively, a deposition of atomic species may be applied by means for depositing atomic species on the stressed layer 2. In a first case, atomic species consisting of the glassy material will be deposited directly. Thus, for example, $SiO_2$ molecules may be deposited in order to form the $SiO_2$ glassy layer 4. In this second case, the following operations will be applied:

deposition of amorphous Si atomic species to form an amorphous Si layer; and then:
thermal oxidization of this amorphous Si layer to thereby form an $SiO_2$ glassy layer 4.

Whichever one of these deposition cases is selected, the deposition of the atomic species should be made before diffusion of Ge, and before contamination and uncontrolled surface reactivation of the stressed layer 2. Uncontrolled surface reactivation may occur if the stressed layer 2 remains at a high temperature.

FIGS. 1d, 1e and 1f illustrate steps for removing the stressed layer 2 and the glassy layer 4 from the donor substrate 1 in order to transfer them onto a receiving substrate 7. For this purpose, the method applies a technique consisting of two successive main steps:

bonding the receiving substrate 7 to the glassy layer 4; and
removing a portion of the donor substrate 1.

FIG. 1i shows application of the bonding. But before bonding, an optional step for forming a bonding layer on at least one of the two surfaces to be bonded may be applied, this bonding layer having binding properties at room temperature or at higher temperatures. Thus, for example, forming a $SiO_2$ layer may improve the quality of the bond, notably if the other surface to be bonded is $SiO_2$ or Si. This $SiO_2$ bonding layer is then advantageously made by depositing $SiO_2$ atomic species, or, if the surface of the latter is in Si, by thermal oxidization of the surface to be bonded.

The surfaces to be bonded may be advantageously prepared before bonding in order to make the surfaces as smooth and as clean as possible. Suitable chemical treatments for cleaning the surfaces to be bonded may be applied, such as weak chemical etchings, an RCA treatment, ozone baths, rinses, etc. Mechanical or mechanical/chemical treatments may also be applied such as polishing, abrasion, CMP (Chemical Mechanical Planarization) or atomic species bombardment.

The bonding operation as such is carried out by bringing the surfaces to be bonded into contact with one another. Bonding linkages are preferably of a molecular nature wherein the hydrophilic properties of the surfaces to be bonded are utilized. In order to impart or enhance the hydrophilic properties of these surfaces, both structures may be dipped in baths or otherwise treated before bonding, for example, they could be rinsed with deionized water.

An annealing step may further be applied to reinforce the bonding linkages, for example, by changing the nature of the bonding linkages, such as covalent linkages or other linkages. Thus, if the glassy layer 4 is made of $SiO_2$, annealing may enhance the bonding linkages, especially if a $SiO_2$ bonding layer has been formed prior to bonding to the receiving substrate 7.

If further details regarding bonding techniques are needed, reference may be made to the document entitled "Semiconductor Wafer Bonding" (Science and technology, Interscience Technology) by Q. Y. Tong, U. Gösele and Wiley.

Once the layers are bonded, material may be removed by separating a portion of the donor substrate 1 at a weakened area 6 present in the donor substrate 1 by supplying energy. With reference to FIGS. 1d and 1e, the weakened area 6 is an area substantially parallel to the bonding surface, and it has a linkage weakness between the lower portion 1a of the donor substrate 1 and the upper portion 1b. The weakness area may be broken to separate the upper portion 1B from the lower portion 1A when thermal or mechanical energy is supplied. According to a first embodiment of the weakened zone or area 6, a technique called SMART-CUT® is applied that first includes implanting an atomic species into the donor substrate 1, at the weakened area 6. The implanted species may be hydrogen, helium, a mixture of both of these species or other lightweight species. The implantation preferably occurs just before bonding. The implantation energy is selected so that the species that is implanted travels through the surface of the glassy layer 4, across the thickness of the glassy layer 4, across the thickness of the stressed layer 2, and to a predetermined depth or thickness of the upper portion 1b of the receiving substrate 1. Implantation into the donor substrate 1 is preferably sufficiently deep so that the stressed layer 2 does not suffer any damage during the detaching step from the donor substrate. The implant depth in the donor substrate is thus typically about 1,000 Å.

The weakness of the linkages in the weakened area 6 mainly depends upon the selection of the dosage of the implanted species. The dosage is typically between about $10^{16}$ cm$^{-2}$ and $10^{17}$ cm$^{-2}$ and more specifically between about $2.10^{16}$ cm$^{-2}$ and about $7.10^{16}$ cm$^{-2}$. Detachment of the weakened area 6 is then usually carried out by supplying mechanical and/or thermal energy. For more details concerning the SMARTCUT® method, reference can be made to the document entitled "Silicon-On-Insulator Technology: Materials to VLSI, $2^{nd}$ edition" by J.-P. Colinge, edited by Kluwer Academic Publishers, pp. 50 and 51.

According to a second embodiment, a technique that is described in U.S. Pat. No. 6,100,166 may be applied to form the weakened area 6. The weakened layer 6 is made before forming the stressed layer 2 and during the formation of the donor substrate 1. The weakened layer may be formed by:

forming a porous layer on a Si backing substrate 1A;
growing a Si layer 1B on the porous layer.

The backing substrate 1A, porous layer and Si layer 1B form the donor substrate 1, and the porous layer forms the weakened area 6 of the donor substrate 1. Detachment can occur by supplying thermal and/or mechanical energy at the porous weakened area 6, to detach the backing substrate 1A from the layer 1B.

The techniques for removing material at a weakened area 6, achieved according to one of the two non-limiting embodiments above, enables a rapid removal of a large portion of the donor substrate 1. Such techniques also permit reuse of the removed portion 1A of the donor substrate 1, for example, to form another donor substrate that could be used, for example, according to the present method. Thus, a stressed layer 2 may be reformed on the portion 1A that has been removed, and another optional portion of a donor substrate and/or other layers may also be applied, preferably after polishing the surface of the portion 1A.

With reference to FIG. 1*f*, after separating the remaining portion 1B from the removed portion 1A of the donor substrate 1, a finishing step can be applied to enable the remaining portion 1B to be removed. Finishing techniques such as polishing, abrasion, CMP planarization, RTA thermal annealing, sacrificial oxidization, chemical etching, can be taken alone or in combination, and may be applied for removing the portion 1B and for perfecting stacking (strengthening the bonding interface, removal of bumps, curing defects, etc.). Advantageously, at least at the end of finishing a step, the removal includes selective chemical etching, either combined or not with mechanical means. Thus, solutions based on KOH, $NH_4OH$ (ammonium hydroxide), TMAH, EDP or $HNO_3$, or solutions presently investigated which combine agents such as $HNO_3$, $HNO_2$, $H_2O_2$, HF, $H_2SO_4$, $H_2SO_2$, $CH_3COOH$, $H_2O_2$ and $H_2O$ (as explained in document WO 99/53539, page 9) may advantageously be used for selectively etching the Si portion 1B relative to the stressed $Si_{1-x}Ge_x$ layer 2.

After the bonding step, another technique could be applied to remove a portion of the donor substrate 1 that does not use a weakened area. This technique consists of applying chemical and/or mechanical/chemical etching. For example, optional selective etchings for the material(s) to be removed from the donor substrate 1 may be applied according to an etch-back type method. This technique consists of etching the donor substrate 1 from the back, i.e. from the free face of the donor substrate 1. Wet etchings may be applied that apply etching solutions suitable for the materials to be removed. Dry etchings may also be applied for removing material, such as plasma or spray etchings. Etching(s) may further only be chemical or electrochemical or photochemical. Etching(s) may be preceded or followed by mechanical abrasion of the donor substrate 1, such as grinding, polishing, mechanical etching or spraying of atomic species. The etching(s) may be accompanied by mechanical abrasion, such as an optional polishing step combined with the action of mechanical abrasives using, for example, a CMP method.

All the aforementioned techniques for removing material from the donor substrate 1 are provided by way of example, but do not limit the present method. The removal method extends to all types of techniques capable of removing material from the donor substrate 1, in accordance with the present method.

With reference to FIG. 1*f*, a portion 1B of the donor substrate 1 is preserved after removal. The stressed layer 2 is buried and thus protected from the external atmosphere. Regardless of which technique is used for removing material, selected from the techniques already discussed or from other known techniques, a surface finishing step for the remaining portion 1B of the donor substrate 1 may be advantageously applied. The finishing step may include selective chemical etching, or CMP polishing, or heat treatment, or bombardment with atomic species or any other smoothing technique.

Thus, after applying a step for removing material that included using a SMART-CUT® type technique, a smoothing treatment can be used, such as one of the following treatments:

polishing in order to obtain a thickness of between about 200 Å to about 800 Å;

$Ar/H_2$ RTA fast annealing followed by polishing in order to obtain a thickness of between about 200 Å to about 800 Å;

a single fast RTA annealing; or $Ar/H_2$ oven annealing.

These finishing treatments are particularly suitable for application to a Si surface (of the remaining portion 1B of the donor substrate 1). It is noted that if the SiGe stressed layer 2 had been exposed, it would have been difficult to apply such techniques without deterioration of the stressed layer 2, as these techniques do not work well for SiGe. Thus, it is an advantage of the above described method that the surface of the Si surface layer 1B can be efficiently smoothed after detachment.

With reference to FIG. 1*f*, after removal of the material, a structure is obtained that includes the receiving substrate 7, the glassy layer 4, the stressed layer 2 and a Si surface layer 1B (which represents the remaining portion of the donor substrate 1). The stressed layer 2 is thus substantially protected from the outside environment by the overlying surface layer 1B and the underlying glassy layer 4.

According to an alternative method, the surface layer 1B is preserved as is. However, with reference to FIG. 1*g*, a second glassy layer 8 is formed at the surface of the structure consisting of a viscous material using a treatment having a second viscosity temperature to form it. The selected material for the second glassy layer 8 may, for example, be one of the following materials: $SiO_2$, BPSG, $SiO_xN_y$. This second glassy layer 8 is preferably formed by transforming the surface layer 1B into a glassy layer, by means of a suitable controlled treatment. Thus, the second glassy layer 8 may be created by using a heat treatment under an atmosphere having a predetermined composition. Thus, the Si surface layer 1B may undergo a controlled thermal oxidization treatment in order to transform this surface layer into a $SiO_2$ glassy layer 8.

During the latter step, it is important to accurately control the various parameters of the oxidizing treatment (such as the temperature, the duration, the oxygen concentration, the other gases in the oxidizing atmosphere, etc.) in order to control the thickness of the oxide layer that is formed, and to stop oxidization in the vicinity of the interface between the layers 2 and 1B. A dry oxygen or steam atmosphere will preferably be used for such thermal oxidization, at a pressure equal to or larger than 1 atmosphere (atm), at a temperature between about 500° C. and about 1,050° C. The duration of oxidization will preferably be varied so as to control the oxidization of the surface layer 8. However, control may also be accomplished by varying one or several of the other parameters, either combined with or separate from the time parameter.

Referring to FIG. 1*g*, heat treatment is applied at a temperature close to or higher than the viscosity temperature. The main purpose of the heat treatment is to relax the stresses in the stressed layer 2. Heat treatment at a temperature higher than or around the viscosity temperature $T_G$ of the glassy layer 4 will cause the surface layer to become viscous, which will allow the stressed layer to relax at its interface with the glassy layer 4, resulting in decompression of at least part of its internal stresses. Thus, if the glassy layer 4 is an $SiO_2$ layer created by thermal oxidization, heat treatment at a minimum of about 1,050° C., and preferably at about a minimum of 1,200° C. for a predetermined duration, will cause relaxation or pseudo-relaxation of the stressed layer 2. The heat treatment typically lasts between a few seconds and several hours.

The relaxation of the stressed layer 2 is achieved without the stressed layer 2 coming into with the outside world, unlike when conventional methods are used, by preventing diffusion of Ge. The stressed layer 2 therefore becomes a relaxed layer 2'.

Other effects of the heat treatment on the structure may be sought, in addition to the relaxation of the stressed layer 2. For example, another reason for using heat treatment may be to anneal to strengthen the bond between the receiving substrate 7 and the glassy layer 4. In fact, because the temperature selected for heat treatment is higher than or around the viscosity temperature of the glassy layer 4, the latter having temporarily become viscous, strong adhesion linkages may be generated with the receiving substrate 7. Thus, again taking the example of bonding between the $SiO_2$ glassy layer 4 and the receiving substrate on which a $SiO_2$ bonding layer has been applied, the viscosities of both of the layers in contact will generate particularly strong covalent linkages.

Another purpose for applying heat treatment is to form the second $SiO_2$ glassy layer 8 by thermal oxidization. It may be desirable to form this glassy layer 8 during or immediately after using heat treatment to relax the stressed layer 2, by simultaneously injecting oxygen into an oven, or else by following that heat treatment with another heat cycle.

As shown in FIG. 1g, a structure 20 is obtained that includes the glassy layer 8, a relaxed $Si_{1-x}Ge_x$ layer 2', a glassy layer 4, and a receiving substrate 7. The relaxed $Si_{1-x}Ge_x$ of layer 2' is thereby protected from the outside by the adjacent glassy layers 4 and 8. In order to expose the relaxed $Si_{1-x}Ge_x$ layer 2', it is then sufficient to remove the glassy layer 8, for example, by means of a suitable chemical treatment. Thus, if the glassy layer 8 is made of $SiO_2$, the structure 20 will advantageously be treated with hydrofluoric acid HF in order to remove $SiO_2$ from the glassy layer 8.

With reference to FIG. 1h, a structure 30 is formed including a relaxed $Si_{1-x}Ge_x$ layer 2', a glassy layer 4, and a receiving substrate 7. This structure 30 is a SGOI structure (Silicon Germanium On Insulator) if the glassy layer 4 is electrically insulating, such as for example a $SiO_2$ glassy layer 4. The relaxed $Si_{1-x}Ge_x$ layer 2' of this structure advantageously has a surface with a surface roughness compatible with growth of another crystalline material. A surface treatment such as a light polishing, suitable for $Si_{1-x}Ge_x$, may optionally be applied in order to improve surface properties.

With reference to FIG. 1i, an optional step of the present method includes growing a Si layer 11 on the relaxed $Si_{1-x}Ge_x$ layer 2'. The Si layer is applied with a thickness substantially less than the stress critical thickness of the material of which it consists, and it is therefore stressed by the relaxed $Si_{1-x}Ge_x$ layer 2'. Thus, a structure consisting of a stressed Si layer, a relaxed $Si_{1-x}Ge_x$ 2' layer, a glassy layer 4, and a receiving substrate 7 is obtained. This structure 40 is a Si/SGOI structure if the glassy layer 4 is electrically insulating, such as for example a $SiO_2$ glassy layer 4.

Alternatives of the present method are presented with reference to FIGS. 2a-2i, FIGS. 3a-3i, and FIGS. 4a-4i.

With reference to FIGS. 2a-2i, and more particularly to FIG. 2g, the method is generally the same as that described with reference to FIGS. 1a-1i, except for the step for transforming the surface layer 1B into a second glassy layer 8. In this case, a different method is applied so that only a portion of the surface layer 1B is transformed. Thus, there exists a remainder or intermediate layer 9 of the Si surface layer 1B between the second glassy layer 8 and the stressed layer 2. With reference to FIG. 2h, this intermediate layer 9 is preserved after heat treatment for relaxing the stressed layer 2. The intermediate layer 9 is advantageously preserved with a thickness less than the stress critical thickness so that it is stressed subsequently by the relaxed layer 2'.

With reference to FIG. 2i, growing a Si layer may be resumed on the intermediate layer 9 in order to form a stressed Si layer 11 substantially identical to that of FIG. 2i. A smoothening step could be applied to the growth surface by means of one of the techniques already discussed before growth of silicon, in order to improve the quality of the crystal growth.

If heat treatment is applied to relax the stresses of the stressed layer 2 at a higher than standard temperature and for longer than a standard duration, then the Ge diffuses into Si and the Ge contained in the stressed layer 2 may diffuse into the intermediate layer 9. Thus, it is preferable to apply the relaxation of the stressed SiGe layer 2 before resuming epitaxial growth of the stressed Si layer 11. However, in certain other cases, this diffusion effect may be sought if it is suitably controlled. Thus, diffusion may be controlled in such a way that the Ge species are uniformly distributed throughout both layers 2 and 9, forming a unique $Si_{1-x}Ge_x$ layer with a substantially uniform Ge concentration. A discussion of this latter point can be found in U.S. Pat. No. 5,461,243 at column 3, lines 48-58.

Figure 3A:
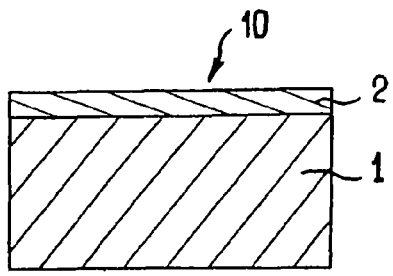
FIGS. 3a-3i illustrate the different steps of a third method according to the invention.
Figure 3B:
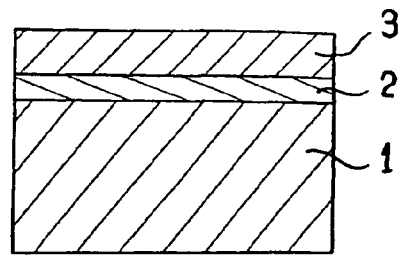
Figure 3C:
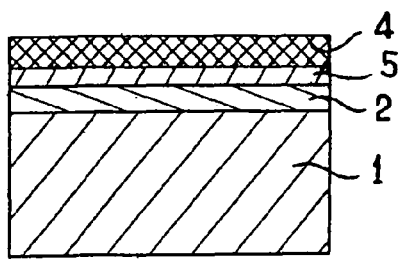
Figure 3D:
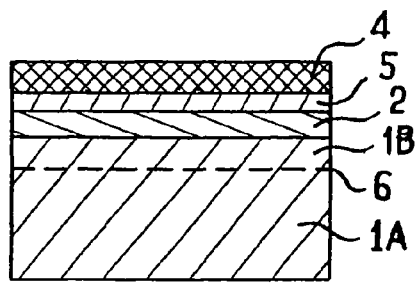
Figure 3E:
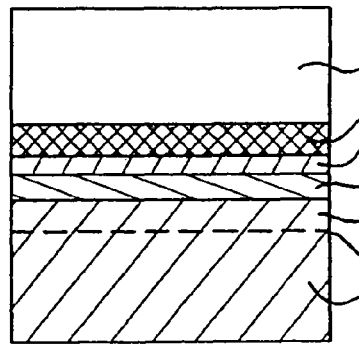
Figure 3F:
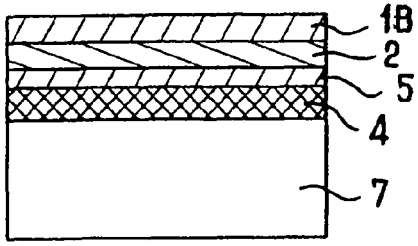
Figure 3G:
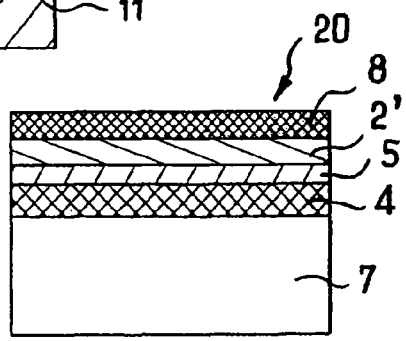

Referring to FIGS. 3a-3i, and more particularly to FIG. 3c, the method illustrated is generally the same as the one described with reference to FIGS. 1a-1i, except for the step of transforming a layer 3 into a glassy layer 4 which is applied so that only a portion of the layer 3 is transformed. Thus, a portion of the Si layer 3 remains inserted between the glassy layer 4 and the stressed layer 2, forming an inserted layer 5. This inserted layer 5 is created to have a thickness of about 10 nm, in any case much less than that of the stressed layer 2. During heat treatment for relaxing the stress of the stressed layer 2, the latter will want to reduce its internal elastic stress energy by utilizing the viscosity properties of the glassy layer 4 which has become viscous. Further, because the inserted layer 5 has a small thickness relatively to the overlying stressed layer 2, the stressed layer 2 will impose its relaxation requirement on the inserted layer 5. The stressed layer 2 thereby forces the inserted layer 5 to be at least partially under stress. The stressed layer 2 then becomes an at least partially relaxed layer 2'. The relaxed inserted layer 5 then becomes a stressed inserted layer 8'. A discussion of the latter point can be found in U.S. Pat. No. 5,461,243 at column 3, lines 28-42.

Figure 3H:
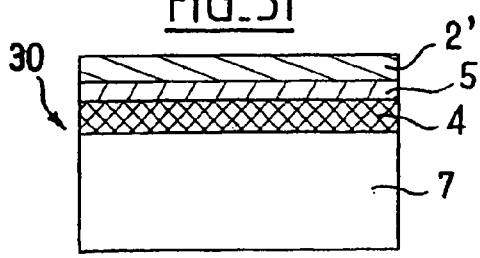

With reference to FIG. 3h, the stressed inserted layer 5' is preserved after the heat treatment for relaxing the stressed layer 2. The structure that is formed consists of a relaxed $Si_{1-x}Ge_x$ layer, a stress Si layer, a glassy layer 4, and a receiving substrate 7. This structure 30 is a SG/SOI structure if the glassy layer 4 is electrically insulating, such as, for example, a $SiO_2$ glassy layer 4. It is then possible to optionally remove, for example by selective chemical etching based on $HF:H_2O_2:CH_3COOH$ (selectivity of about 1:1,000), the relaxed $Si_{1-x}Ge_x$ layer 2', in order to finally obtain a structure consisting of a stressed Si layer, a glassy layer 4, and a receiving substrate 7. This structure is a stressed SOI structure if the glassy layer 4 is electrically insulating, such as, for example, a $SiO_2$ glassy layer 4.

Figure 3I:
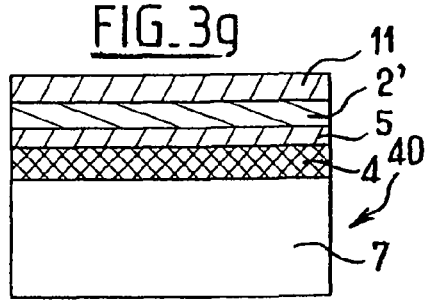

Instead of applying chemical etching, it is possible to resume growth of a Si layer on the relaxed layer 2'a shown in FIG. 3i, so as to form a stressed Si layer 11. The resulting structure 40 consists of a stressed Si layer, a relaxed $Si_{1-x}Ge_x$ layer, a stressed Si layer, a glassy layer 4, and a receiving substrate 7. This structure 40 is a Si/SG/SOI structure, if the glassy layer 4 is electrically insulating, such as, for example, a SiO$_2$ glassy layer 4. In a particular scenario, if heat treatment for relaxing the stresses of the stressed layer 2 is carried out at a temperature that is higher than a standard temperature and for longer than a standard duration, such that Ge diffuses into Si, the Ge contained in the stressed layer 2 may diffuse into the stressed inserted layer 5'. Thus, it is preferable to apply the relaxation of the stressed SiGe layer 2 before resuming epitaxy of the stressed Si layer 11. But this diffusion effect may be desirable in certain other cases, and the parameters may be suitably controlled to obtain this result. Thus, diffusion may be controlled in such a way that the Ge species are distributed uniformly throughout both layers 2 and 5 to form a unique Si$_{1-x}$Ge$_x$ layer with a substantially uniform Ge concentration. A discussion of the latter point can be found in U.S. Pat. No. 5,461,243, at column 3, lines 48-58.

With reference to FIGS. 4a-4i, and more particularly to FIGS. 4c and 4g, a method is illustrated that generally is the same as the one described with reference to FIGS. 1a-1i, except that:

Only part of the layer 3 is transformed into a glassy layer 4;
The surface layer 1B is not transformed into a second glassy layer 8.

In fact, this method includes a step identical to the one described with reference to FIG. 3c, forming an inserted layer 5 (see FIG. 3c), and a step identical to the one described with reference to FIG. 2g, forming an intermediate layer 9 (see FIG. 2g). The means for forming both of these layers 5 and 9, as well as the possibilities for developing their structure and their effect on the final structure, are therefore substantially the same as those described with reference to FIGS. 2a-2i and to FIGS. 3a-3i.

Figure 5A:
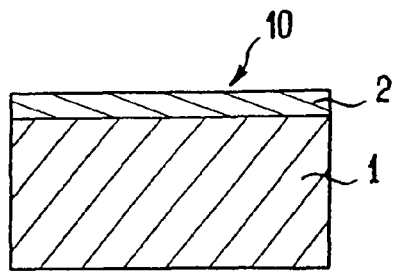
FIGS. 5a-5h illustrate the different steps of a fifth method according to the invention.
Figure 5B:
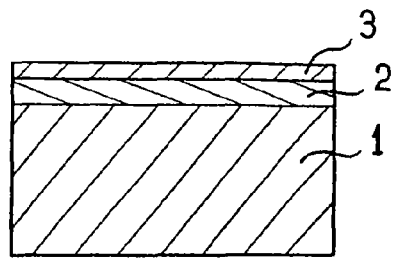
Figure 5C:
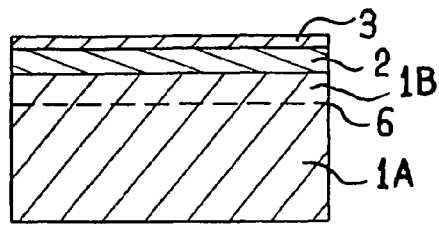
Figure 5D:
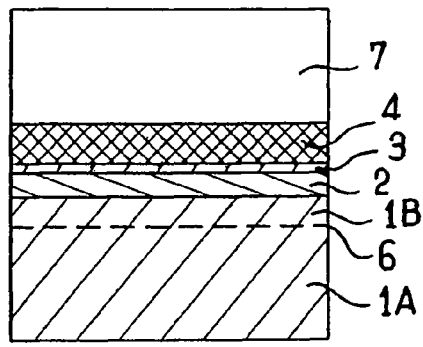
Figure 5E:
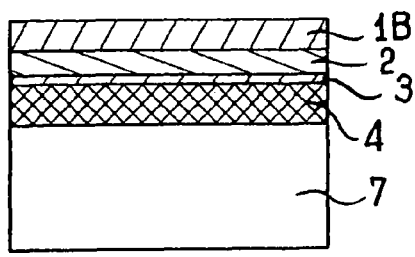
Figure 5F:
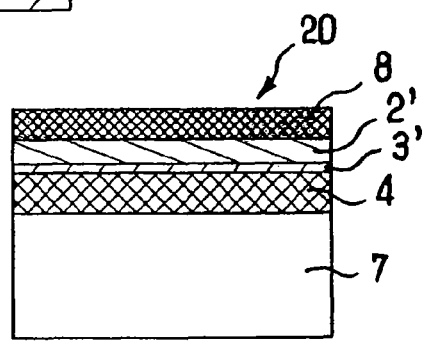

With reference to FIGS. 5a-5h, and more particularly to FIGS. 5b and 5d, the method is generally the same as the one described above with reference to FIGS. 1a-1i, except that:

with reference to step 5b, the epitaxial Si layer 3 on the stressed layer 2 is a very thin layer, the thickness of which is much less than that of the stressed layer 2, typically from about 100 to 300 Å;
with reference to FIG. 5d, the glassy layer 4 is formed on the receiving substrate 7.

The Si layer 3 will thus enable the overlying SiGe stressed layer 2 to be protected from Ge diffusion, external contamination and uncontrolled potential reactivation of its surface. A suitable surface finishing method can be applied to the Si, whereas such suitable methods do not exist for SiGe. These finishing techniques (already detailed above) may provide good bonding with the receiving substrate 7.

With reference to FIG. 5d, according to a first embodiment, the glassy layer 4 is formed before bonding onto the receiving substrate 7. The material forming the glassy layer 4 is such that it becomes viscous at a viscosity temperature T$_G$. Advantageously, the material of the glassy layer 4 is one of the following materials: BPSG, SiO$_2$, SiON. This first embodiment for forming the glassy layer 4 on the receiving substrate is similar to the first embodiment for forming the glassy layer 4 on the stressed layer 2 as described above with reference to FIG. 1c. Thus, for example, oxidization of the Si surface of the receiving substrate 7 may form a SiO$_2$ glassy layer 4. It is important that the formation of the glassy layer 4 and the bonding of the glassy layer 4 with the stressed layer 2 be completed before Ge diffusion, contamination and uncontrolled reactivation of the surface of the stressed layer 2, especially if the stressed layer 2 remains at a high temperature.

According to a second embodiment for forming the glassy layer 4 on the receiving substrate, deposition of atomic species is applied by means for depositing atomic species on the receiving substrate 7. In a first case, the atomic species consisting of glassy material such as SiO$_2$ will be directly deposited. In a second case, the following operations will be applied:

deposition of amorphous Si atomic species in order to form an amorphous Si layer, and then:
thermal oxidization of the amorphous Si layer to thereby form a SiO$_2$ glassy layer 4.

Whichever deposition case is selected, deposition of the atomic species should be achieved before Ge diffusion, contamination and uncontrolled reactivation of the surface of the stressed layer 2, and especially if the stressed layer 2 remains at a high temperature.

With reference to FIGS. 5e, 5f, 5g and 5h, the same conditions and the same configurations as those discussed above with reference to FIGS. 3f, 3f, 3h and 3i apply, whereby the referenced layer 5 becomes the referenced layer 3 in the present method. In particular, during the heat treatment for relaxation the stressed layer 2 becomes at least a partially relaxed layer 2', and the inserted layer 3 then becomes a stressed inserted layer 3'.

Figure 5G:
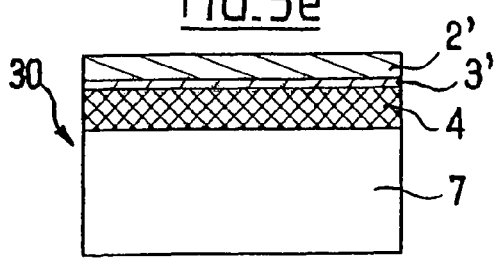
Figure 7:
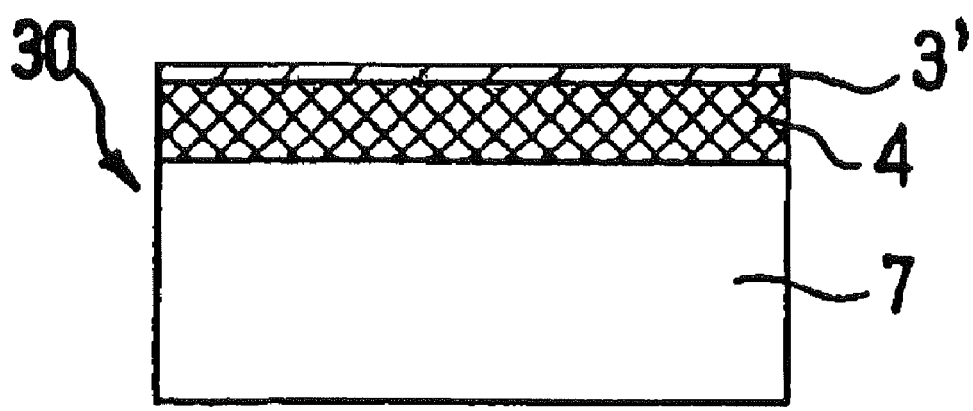
FIG. 7 is an illustration of a structure having an exposed strained layer as provided, e.g., by the processes of FIG. 5.

With reference to FIG. 5g, the formed structure consists of relaxed Si$_{1-x}$Ge$_x$, a stressed Si layer, a glassy layer 4, and a receiving substrate 7. This structure 30 is a SG/SOI structure, if the glassy layer 4 is electrically insulating, such as for example a SiO$_2$ glassy layer 4. The relaxed Si$_{1-x}$Ge$_x$ layer 2' may then be optionally removed, for example by selective chemical etching based on HF:H$_2$O$_2$:CH$_3$COOH (selectivity of about 1:1,000) in order to finally have a structure consisting of a stressed Si layer, a glassy layer 4, and a receiving substrate 7, as shown in FIG. 7. This structure is a stressed SOI structure, if the glassy layer 4 is electrically insulating, such as for example a SiO$_2$ glassy layer 4.

Figure 5H:
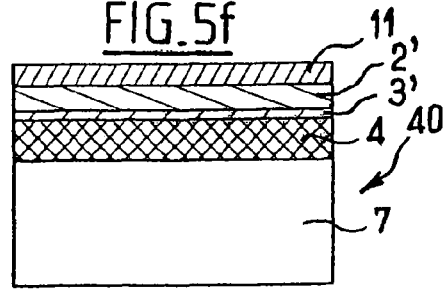

Instead of applying chemical etching, it is possible to grow a Si layer, with reference to FIG. 5h, by resuming growth on the relaxed layer 2' in order to form a stressed Si layer 11, substantially identical to that shown in FIG. 5h. The structure 40 consists of a stressed Si layer, a relaxed Si$_{1-x}$Ge$_x$ layer, a stressed Si layer, a glassy layer 4, and a receiving substrate 7. This structure 40 is a Si/SG/SOI structure, if the glassy layer 4 is electrically insulating, such as for example a SiO$_2$ glassy layer 4.

If the heat treatment for relaxing the stresses of the stressed layer 2 is carried out at a higher than standard temperature and longer than a standard duration for which Ge diffuses into Si, then the Ge contained in the stressed layer 2 may diffuse into the stressed inserted layer 3'. This is why it is preferable to apply relaxation of the stressed SiGe layer 2 before resuming epitaxial growth of the stressed Si layer 11. However, in certain cases, this diffusion effect, if it is suitably controlled, may be desired.

Thus, diffusion may be controlled in such a way that the Ge species are uniformly distributed throughout both layers 2 and 5, forming a unique Si$_{1-x}$Ge$_x$ layer with a substantially uniform Ge concentration. A discussion of this point can be found in U.S. Pat. No. 5,461,243 at column 3, lines 48-58.

Figure 6A:
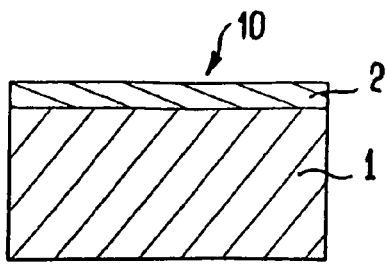
FIGS. 6a-6h illustrate the different steps of a sixth method according to the invention.
Figure 6B:
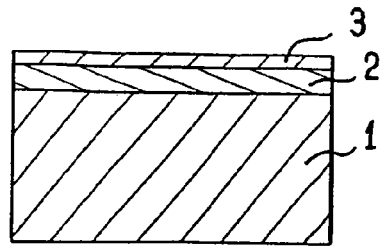
Figure 6C:
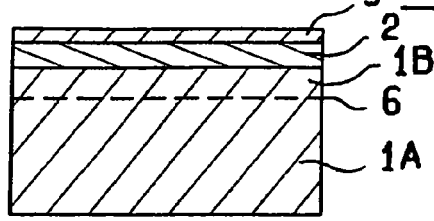
Figure 6D:
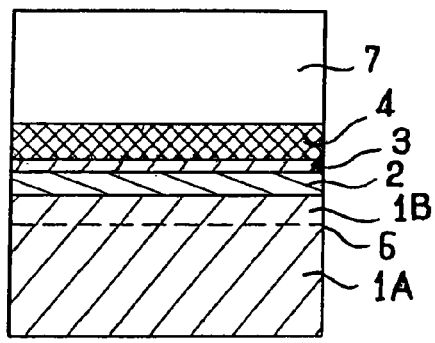
Figure 6E:
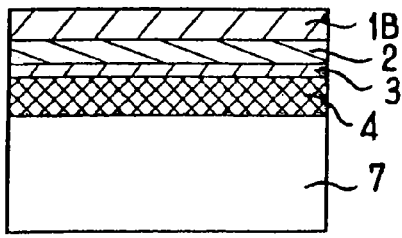
Figure 6F:
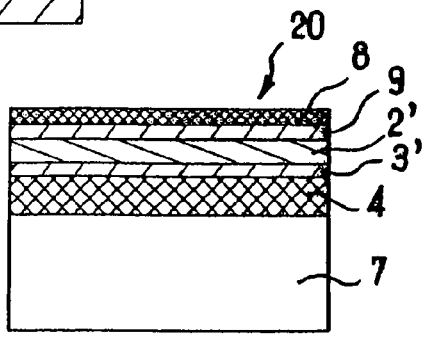
Figure 6G:
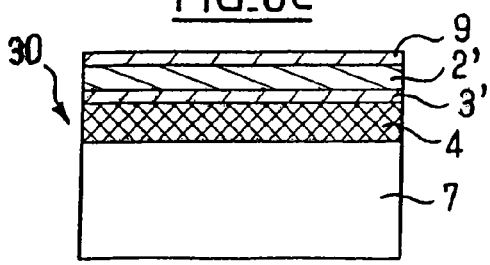

With reference to FIGS. 6a-6h, and more particularly to FIG. 6f, the method is generally the same as the one described with reference to FIGS. 5a-5h, except for the step for transforming the surface layer 1B into a second glassy layer 8, which is applied to transform only a portion of the surface layer 1B. Thus, a portion of the Si surface layer 1B remains inserted between the second glassy layer 8 and the stressed layer 2, forming an intermediate layer 9. With reference to FIG. 6g, this intermediate layer 9 is preserved after the heat treatment for relaxing the stressed layer 2. Advantageously, this intermediate layer 9 has a thickness less than the stress critical thickness, so that it is stressed subsequently by the relaxed layer 2'.

Figure 6H:
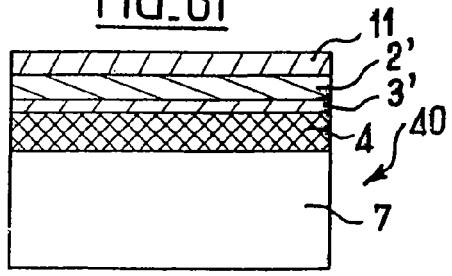

With reference to FIG. 6h, it is possible to resume growth of a Si layer on the intermediate layer 9 so as to form a stressed Si layer 11, substantially identical with that of FIG. 5h. A smoothing step for the growth surface by means of one of the techniques already discussed above may be applied prior to growing silicon, in order to enhance the quality of the crystal growth to be applied.

If the heat treatment for relaxing the stresses of the stressed layer 2 is carried out at a temperature and for a duration higher than a standard temperature and longer than a standard duration, wherein Ge diffuses into Si, then Ge contained in the stressed layer 2 may diffuse into the intermediate layer 9 or into the inserted layer 3. This is why it is preferable to apply the relaxation of the stressed SiGe layer 2 before resuming epitaxial growth of the stressed Si layer 11. However, in certain other cases, this diffusion effect, if it is suitably controlled, may be desired. Thus, diffusion may be controlled so that the Ge species are uniformly distributed throughout both layers 2, 3 and 9, forming a unique $Si_{1-x}Ge_x$ layer with a substantially uniform Ge concentration. A discussion of this point can be found in U.S. Pat. No. 5,461,243 at column 3, lines 48-58.

Steps for making components can be integrated according to any of the six methods described above, or by equivalents thereof. Thus, preparation steps for making components may be applied during the method at the stressed SiGe layer 2 of the structure with reference to FIG. 1g, 2g, 3g, 4g, 5f or 6f, at the relaxed or pseudo-relaxed SiGe layer 2' of the SGOI structure with reference to FIG. 1h, 2h, 3h, 4h, 5g or 6g, or in the stressed Si layer 11 of the Si/SGOI structure with reference to FIG. 1i, 2i, 3i, 4i, 5h or 6h. Preferably, these preparation steps will be achieved with the glassy layer 8 always present in the structure, the latter protecting the underlying layers, and especially the stressed layer 2 or the relaxed layer 2', both in SiGe. For example, local treatments may be undertaken for etching patterns in the layers through the glassy layer 8, for example by lithography, photolithography, reactive ion etching, or any other etching technique with pattern masking.

In a particular case, patterns such as islands can be etched into the SiGe stressed layer 2 in order to contribute to proper relaxation of the stressed layer 2 during the subsequent application of the relaxation heat treatment.

One or several steps for making components, such as transistors, in the stressed Si layer 11 (or in the relaxed SiGe layer 2' if the latter is not covered with a stressed Si layer 11) may be applied, preferably at a temperature less than $T_G$ (so as not to change the stress ratio of the relaxed layer 2' and the stressed layer 11).

In a particular method according to the invention, steps for making the components are applied during or in continuity with the heat treatment for relaxing the stressed SiGe layer 2.

In a particular method according to the invention, the step for epitaxial growth of the stressed Si layer is applied during or in continuity with the steps for making the components.

The techniques described in the invention are provided by way of example, but are by no means limited, because the invention may extend to all types of techniques that could apply a method according to the invention.

One or any epitaxial growth processes may be applied onto the final structure (structure 30 or 40 taken with reference to FIGS. 1h, 1i, 2h, 2i, 3h, 3i, 4h, 4i, 5g, 5h, 6g, 6h), such as epitaxial growth of a SiGe or SiGeC layer, or of a stressed Si or SiC layer, or successive epitaxial growths of SiGe or SiGeC layers and of alternately stressed Si or SiC layers in order to form a multilayer structure.

Upon completion of the final structure, finishing treatments may optionally be applied, including an annealing step, for example.

The present invention is also not limited to a SiGe stressed layer 2, but also extends to forming the stressed layer 2 in other types of materials of the III-V or II-VI type, or other semiconductor materials.

In the semiconductor layers discussed in this document, other constituents may be added thereto, such as carbon with a carbon concentration in the relevant layer substantially less than or equal to 50% or, more particularly with a concentration less than or equal to 5%.

What is claimed is:

1. A method for relaxing a layer of a strained material on a substrate which method comprises:
    providing an elastically stressed layer on a first substrate;
    providing a first glassy layer on the stressed layer or upon a second substrate;
    bonding the first and second substrates together with the stressed layer and first glassy layer therebetween;
    removing the first substrate to obtain a structure comprising the stressed layer, first glassy layer and second substrate;
    providing a second glassy layer on the stressed layer; and
    heat treating the structure at a temperature close to or higher than the viscosity temperature of one or both of the glassy layers to convert the stressed layer to a relaxed or pseudo-relaxed layer.

2. The method of claim 1, wherein the heat treating temperature is about 1150 to 1500° C.

3. The method of claim 1, wherein the heat treating temperature is about 1150 to 1200° C.

4. The method of claim 1, wherein the stressed layer is provided by growing the layer on the first substrate.

5. The method of claim 1, wherein the first glassy layer comprises a viscous material having an associated viscosity temperature, and the heat treating is conducted at or above the viscosity temperature.

6. The method of claim 1, wherein the second glassy layer is provided by removing a portion of the first glassy layer and leaving a surface layer of the first substrate on the structure, applying a controlled treatment to transform at least a portion or all of the surface layer to a viscous material having an associated viscosity temperature, and the heat treating is conducted at or above the viscosity temperature.

7. The method of claim 6, which further comprises growing a further layer on the structure.

8. The method of claim 7, which further comprises removing the second glassy layer before growing the further layer.

* * * * *